United States Patent
Ashida (10) Patent No.: US 6,401,235 B1
(45) Date of Patent: Jun. 4, 2002

(54) METHOD OF AND APPARATUS FOR PRODUCING EXPOSURE MASK

(75) Inventor: Isao Ashida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/082,914

(22) Filed: May 21, 1998

(30) Foreign Application Priority Data

May 21, 1997 (JP) ................................. 9-131454

(51) Int. Cl.[7] .............................. G06F 7/60; G21K 5/10
(52) U.S. Cl. ..................... 716/19; 716/21; 250/492.22
(58) Field of Search .......................... 716/19, 20, 21, 716/1, 2, 4, 5; 250/492.1, 492.2, 492.21, 492.22, 492.23, 492.24, 492.3

(56) References Cited

U.S. PATENT DOCUMENTS

| | | | | | |
|---|---|---|---|---|---|
| 4,093,990 A | * | 6/1978 | Koller et al. | ................ | 364/520 |
| 5,253,182 A | * | 10/1993 | Suzuki | ....................... | 364/489 |
| 5,287,290 A | * | 2/1994 | Tabara et al. | .................. | 716/5 |
| 5,428,552 A | * | 6/1995 | Rudert, Jr. et al. | ........... | 716/21 |
| 5,448,494 A | * | 9/1995 | Kobayashi et al. | ............ | 716/5 |
| 5,450,332 A | * | 9/1995 | Criscuoli et al. | ............. | 716/21 |
| 5,481,472 A | * | 1/1996 | Chung et al. | .................. | 716/21 |
| 5,768,144 A | * | 6/1998 | Nagase | ......................... | 716/4 |

* cited by examiner

*Primary Examiner*—Matthew Smith
*Assistant Examiner*—Leigh Marie Garbowski
(74) *Attorney, Agent, or Firm*—Sonnenschein, Nath & Rosenthal (57) ABSTRACT

The invention provides a method and an apparatus for producing an exposure mask by which an exposure mask can be produced in a reduced production period and with a high degree of reliability. Data division which does not have an influence on a pattern of an exposure mask is indicated, and indication data which include a predetermined index code is retrieved from layout data to produce a file. Then, the layout data are divided in accordance with the file, and for each of the divided layout data, a corresponding one of processes is selectively performed in accordance with a condition. EB files produced by such processes are unified in accordance with the file to produce a plotting job.

14 Claims, 4 Drawing Sheets

METHOD OF AND APPARATUS FOR PRODUCING EXPOSURE MASK

BACKGROUND OF THE INVENTION

This invention relates to a method of and an apparatus for producing an exposure mask.

An exposure mask such as a photo-mask which is used to produce a semiconductor device is produced, for example, in the following manner.

Figure 5:
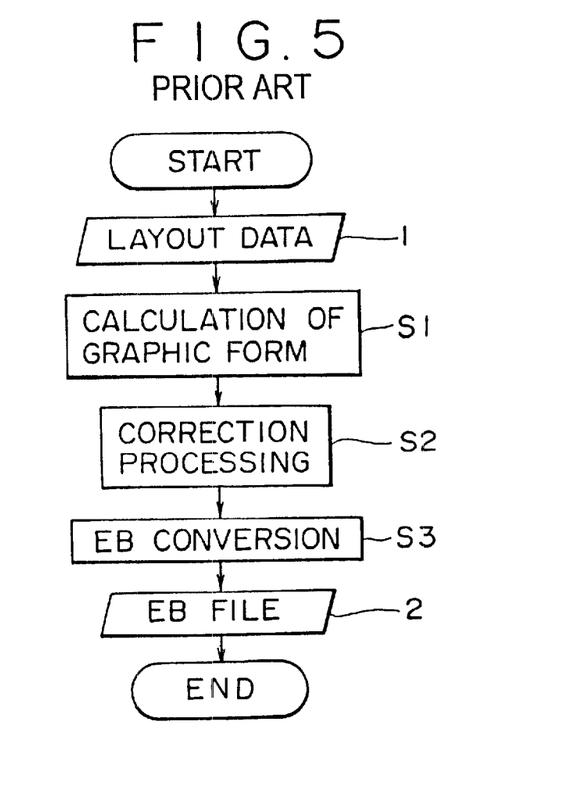
FIG. 5 is a flow chart illustrating an outline of a process of production of an EB file according to a popular production method for an exposure mask.

FIG. 5 illustrates in flow chart an outline of a process of producing an electron beam (EB) file in a method of producing an exposure mask.

Referring to FIG. 5, using an LSI designing CAD (computer aided design) apparatus, a designer first performs LSI designing to produce LSI pattern data (hereinafter referred to also as layout data) in accordance with an exposure mask to be produced.

Then, graphic form calculation is performed for the layout data (step S1) and pattern correction (step S2) is performed if necessary, and then EB conversion is performed (step S3) to produce an EB file 2 which is an input format for an EB plotting apparatus.

However, when an exposure mask for production of a semiconductor device which includes repetitions of a same pattern such as, for example, a memory device is to be produced, if it is tried to produce the entire mask in a batch in accordance with the procedure illustrated in FIG. 5, then a large number of same patterns are produced at different positions. This is low in the efficiency. Further, it sometimes occurs that data regarding specifications for an exposure mask are required separately.

Division Processing of Layout Data

Figure 6:
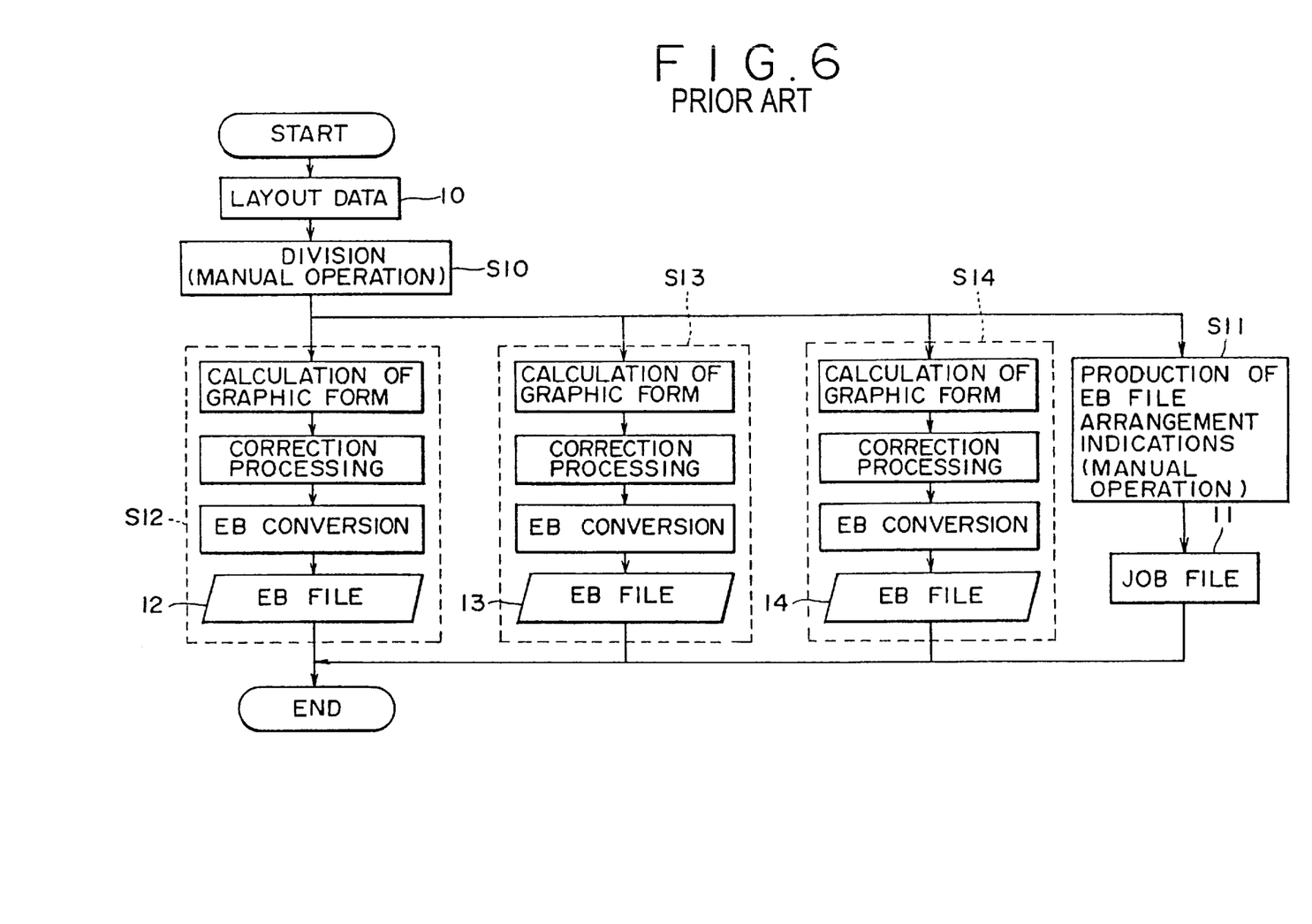
FIG. 6 is a flow chart illustrating an outline of a process of production of an EB file when division processing for layout data is performed.

Another method is available wherein, for example, as seen from FIG. 6, layout data are divided for individual repetitive regions and a procedure same as that illustrated in FIG. 5 is applied to each of the thus divided layout data.

In the method just described, it must be indicated how to divide layout data. The indication may be given by a method wherein coordinate values of an area to be produced by division are designated or another method wherein the name of any of cells which compose layout data (layout data are normally designed hierarchically, and each of such hierarchies is called cell) is designated.

In the method illustrated in FIG. 6, layout data 10 are divided (step S10), and one of processes in steps S12, S13 and S14 is selectively performed for each of the plurality of data obtained by the division in accordance with conditions to produce EB files 12, 13 and 14, respectively. Further, a job file (hereinafter referred to also as plotting job) 11 which designates arrangements and/or repetitions necessary for the EB files 12, 13 and 14 is produced (step S11) to re-construct the entire mask image.

However, the operation for dividing the layout data 10 (step S10) and the operation for producing the plotting job 11 (step S11) rely much upon manual operation and make a bottle neck to the process of production of an exposure mask.

Further, where an exposure mask to be produced locally has, for convenience in layout designing, an area in which a different processing method for graphic form calculation is to be performed or another area in which a different correction method is performed, since batch processing based on the procedure illustrated in FIG. 5 is impossible, the layout data are divided into portions for which different processes should be performed and are processed in accordance with the procedure illustrated in FIG. 6.

Also in this instance, an indication for such division may be given by a method wherein coordinate values of the areas are designated or another method wherein names of cells which compose the layout data are designated, and this gives rise to the problem described above.

Further, layout data may be processed dividing them into portions for which different quantization steps are used.

In particular, upon EB conversion, coordinate values of pattern data are quantized into minimum units which are handled by a plotting apparatus. Generally in layout designing, a design grid is selected so that rounding of coordinate values may not occur in such quantization to produce pattern data.

However, when it is intended to shrink already designed pattern data to produce a mask or when there are layout data which include a partially different design grid, in order to prevent rounding of a pattern upon quantization of EB conversion, the plotting unit dimension of the plotting apparatus (where an electron beam plotting apparatus of the raster scanning type is employed, such processing as to partially vary the plotting unit dimension is called spot size) on the same mask to set the individual quantization units to such varies with which no rounding occurs.

Also in such an instance as just described, processing is performed in accordance with the procedure illustrated in FIG. 6, in which portions having different quantization dimensions are processed after division processing is performed. Therefore, the problem described above arises similarly.

Inspection of an Exposure Mask

An exposure mask produced is normally inspected using a defect inspection apparatus and is shipped after it is guaranteed that it is free from a defect or does not have a defect of a certain fixed level.

Consequently, where a plurality of same LSI chip patterns (hereinafter referred to chips) are present on the exposure mask, two methods are available including a method wherein coordinate values of rectangular areas occupied by the chips and information that the patterns of the chips are same as each other are indicated to the defect inspection apparatus to indicate it to the defect inspection apparatus to perform comparison inspection between the patterns of the areas and another method wherein coordinate values of the rectangular areas other than a rectangular area of an object of inspection by visual observation are indicated to indicate it to the defect inspection apparatus to perform comparison inspection with pattern data used for plotting based on an EB file (for example, an EB file or EB files and a plotting job).

Also a case exists wherein defect inspection with a defect inspection apparatus is not performed correctly due to presence of a special pattern in an area designated as an object of inspection. This is a case wherein, generally where a pattern on data is excessively small with respect to the inspection capacity (accuracy) of the defect inspection apparatus or to the capacity (pattern formation accuracy) of the mask production process, a false defect is detected.

Where such a situation as described above is known in advance, the area is designated as a non-object area of defect inspection also in coordinate values of a rectangular area.

While such area coordinate values depend upon patterns on layout data, the data are delivered using another medium different from the layout data such as a different file on a computer or paper.

Therefore, as an operation for such data delivery, an operator must read the coordinate values from the layout data. Here, there is the possibility that an artificial reading error may occur. Further, since the thus read data are copied to another medium, also a mistake in copying may possibly occur.

Accuracy Guarantee of Exposure Mask

As a method of guaranteeing the accuracy of the exposure mask produced, in addition to the defect inspection described above, the dimensions of the detailed patterns on the produced exposure mask are measured and it is measured whether the dimensions on the data remain within tolerances corresponding to the required accuracy to guarantee the accuracy in dimension of the patterns on the exposure mask.

Here, it is necessary to measure any pattern on the exposure mask and deliver as data what are the detailed dimensions of the pattern.

While also those data depend upon the pattern on the layout similarly to the area data for defect inspection described above, as a delivery method therefor, the data are delivered in the form of a medium different from the layout data such as another file on a computer or paper.

Accordingly, similarly as in the case of the defect inspection described above, there is the possibility that a miss by an operation by a person may occur.

Specifications of Exposure Mask

Data regarding specifications of a mask other than those described above such as a material to be used for the production of the mask, the thickness, size and accuracy of the mask, and a name to be indicated on the mask are not included in the layout data.

Therefore, such data are delivered using some medium such as paper. Consequently, when the data are delivered, or when, after such data are delivered, data of a plurality of media are confirmed and necessary processing is performed, a miss by the operator may possibly occur.

Furthermore, if a plurality of media which describe mask specifications are present, then there is the possibility that data on the media may be mistaken for data for another mask or any of the media may be mistaken for another file on a computer or some other paper such as specification paper.

Where, in a process of production of an exposure mask, an operation for dividing layout data, indication of data for inspection of the exposure mask, indication of data for accuracy guarantee of the exposure mask and management of specification papers for the exposure mask are performed manually by a designer or an operator as in the procedure described hereinabove with reference to FIG. 6, the production process for the exposure mask is interrupted. Consequently, there is a problem in that the period required for the production of the exposure mask is increased accordingly and there is a high degree of possibility that a miss by a person may occur.

SUMMARY OF THE INVENTION

It is an object of the present invention to provide a production method and apparatus for an exposure mask by which an exposure mask can be produced in a reduced production period and with a high degree of reliability.

In order to attain the object described above, according to an aspect of the present invention, there is provided a method of producing an exposure mask, comprising the steps of retrieving, from layout data, indication data which indicate a data process which does not have an influence on a pattern itself of an exposure mask and include a predetermined index code, producing a file based on the retrieved indication data, performing the data process based on the file and processing the layout data with the processed data to produce a pattern file and a plotting job, and performing plotting based on the pattern file and the plotting job to produce an exposure mask.

The pattern file is, for example, an EB file where plotting is performed using an electron beam (EB). In the present specification, since it is described that plotting is performed by using an EB, the pattern file is referred to as EB file. Naturally, however, plotting may be performed not using an EB but using a laser beam.

The data process is, for example, a process for dividing the layout data in accordance with a processing condition. In this instance, the layout data divided based on the file and processed are unified to produce the plotting job.

In particular, in the step of production of layout data, a designer places, in accordance with the necessity, indication data which indicate a data process which does not have an influence on a pattern itself of an exposure mask into the layout data. For example, the designer places, for example, into a definition of a cell, indication data indicating that the layout data regarding the cell should be divided and processed in accordance with a processing condition.

Then, from the layout data, the indication data are automatically retrieved, for example, by a system, and the layout data regarding the cell are divided in accordance with the thus retrieved indication data and processed. Further, contents of the indication data are stored into a single file.

At a next stage in which a plotting job is to be produced, the divided and processed layout data are unified based on the file to produce the plotting job.

According to another aspect of the present invention, there is provided an apparatus for producing an exposure mask wherein plotting is performed based on a plotting job produced from layout data to produce an exposure mask, comprising retrieval means for retrieving, from the layout data, indication data which indicate a data process which does not have an influence on a pattern itself of an exposure mask and include a predetermined index code, file production means for producing a file based on the retrieved indication data, data processing means for performing the data process based on the file, and means for producing a pattern file and a plotting job from the layout data based on the data processed by said data processing means.

With the method of and apparatus for producing an exposure mask, the period for production of an exposure mask can be reduced and the reliability in the process of production of an exposure can be improved.

The above and other objects, features and advantages of the present invention will become apparent from the following description and the appended claims, taken in conjunction with the accompanying drawings in which like parts or elements denoted by like reference symbols.

DESCRIPTION OF THE PREFERRED EMBODIMENT

In an exposure mask production method and apparatus to which the present invention is applied, if a designer places a predetermined indication into layout data, then such files as a division data file, an inspection area data file, an accuracy guarantee data file and a specification file are automatically produced in a process of production of a plotting job from the layout data, and based on the files, division processing for the layout data, production processing of a plotting job, an inspection step and an accuracy guarantee step are performed in a consistent flow.

In the "GDS II Stream" which is a description format of layout data, it is admitted to describe, in addition to a description (indication or instruction) which indicates a pattern itself of an exposure mask, character train data as indication data (additional data).

Such indication data are divided into two types including character train data (hereinafter referred to also as property data) belonging to the pattern data and character train data (hereinafter referred to also as text data) independent of the pattern data.

In a preferred embodiment of the present invention which is hereinafter described in detail, various kinds of data necessary for production of an exposure mask are included as property data and text data in layout data so that production, inspection and accuracy guarantee of an exposure mask can be performed in a consistent flow using the property data and the text data.

In particular, graphic form calculation indication data and division indication data which designates a name of a cell which makes an object of division processing are described in a cell definition in layout data. Further, division indication data which designates an area which makes an object of division processing and inspection area indication data are added as property data in a definition of a rectangle indicative of the area in layout data. Further, dimension indication position data for accuracy guarantee are added as property data in a definition of a pass graphic form representative of the direction of measurement and the length in the layout data. Furthermore, for example, specification data regarding specifications of the exposure mask are added at an arbitrary position in the layout data.

In order to indicate that such graphic form calculation indication data, division indication data, inspection area indication data, dimension indication position data and specification data as described above are indication data unique to the embodiment of the present invention different from the other indication data (property data and text data), a character train of, for example, "MASK", is described as an index code at the top of the data.

In the following, the indication data unique to the present embodiment are individually described in detail.

Graphic Form Calculation Indication Data

The graphic form calculation indication data indicate how to produce a pattern of an exposure mask from hierarchies indicated by layout data.

Generally, in layout data, patterns in a cell are classified into hierarchies using numerals or titles.

A hierarchy classified by the layout data may correspond uniquely to a pattern of an exposure mask to be produced, or a plurality of such hierarchies may correspond or a plurality of layers for which graphic form calculation processing is performed may correspond to a pattern.

Thus, a relationship between a hierarchy indicated by layout data and s mask pattern of an exposure mask to be produced must be indicated, and this is indicated by a graphic form calculation indication.

While it is considered that the graphic form calculation indication is uniformly used in the entire layout data, different graphic form calculation indications may be used for different places on the same mask such as where the mask includes patterns for which different designing techniques are to be used.

Thus, by describing a combination of an object mask name and the graphic form calculation indication in the form of a character train in a definition of a cell, the graphic form calculation indication indicates to apply the graphic form calculation indication to patterns of hierarchies lower than a hierarchy of the cell.

For example, by placing the following character train (1)

$$\text{MASK PATTERN GATE 4|(21\&33)} \tag{1}$$

in a certain cell definition described in layout data, the graphic form calculation indication indicated here is applied to hierarchy patterns lower than the cell.

The characters "MASK" in the character train (1) above represent a keyword which indicates that the indication is for indication data unique to the present embodiment different from the other character trains of property data and text data. Meanwhile, "PATTERN" is a keyword indicative of a graphic form calculation information. "GATE" indicates the name of an exposure mask which makes an object of the graphic form calculation indication and indicates a method of producing a pattern of the designated exposure mask. "4|(21&33)" r represents a graphic form calculation to be processed and signifies that a pattern obtained by performing graphic ORing processing for a pattern obtained by performing graphic ANDing processing for a pattern of the hierarchy number "21" and another pattern of the hierarchy number "33" and a pattern of the hierarchy number "4" is named as "GATE" as the exposure mask name.

Division Indication Data Designating Cell Name

In a definition of a cell which makes an object of division processing in layout data, data representing that the cell is an object of division processing is indicated in the form of text data.

Figure 2:
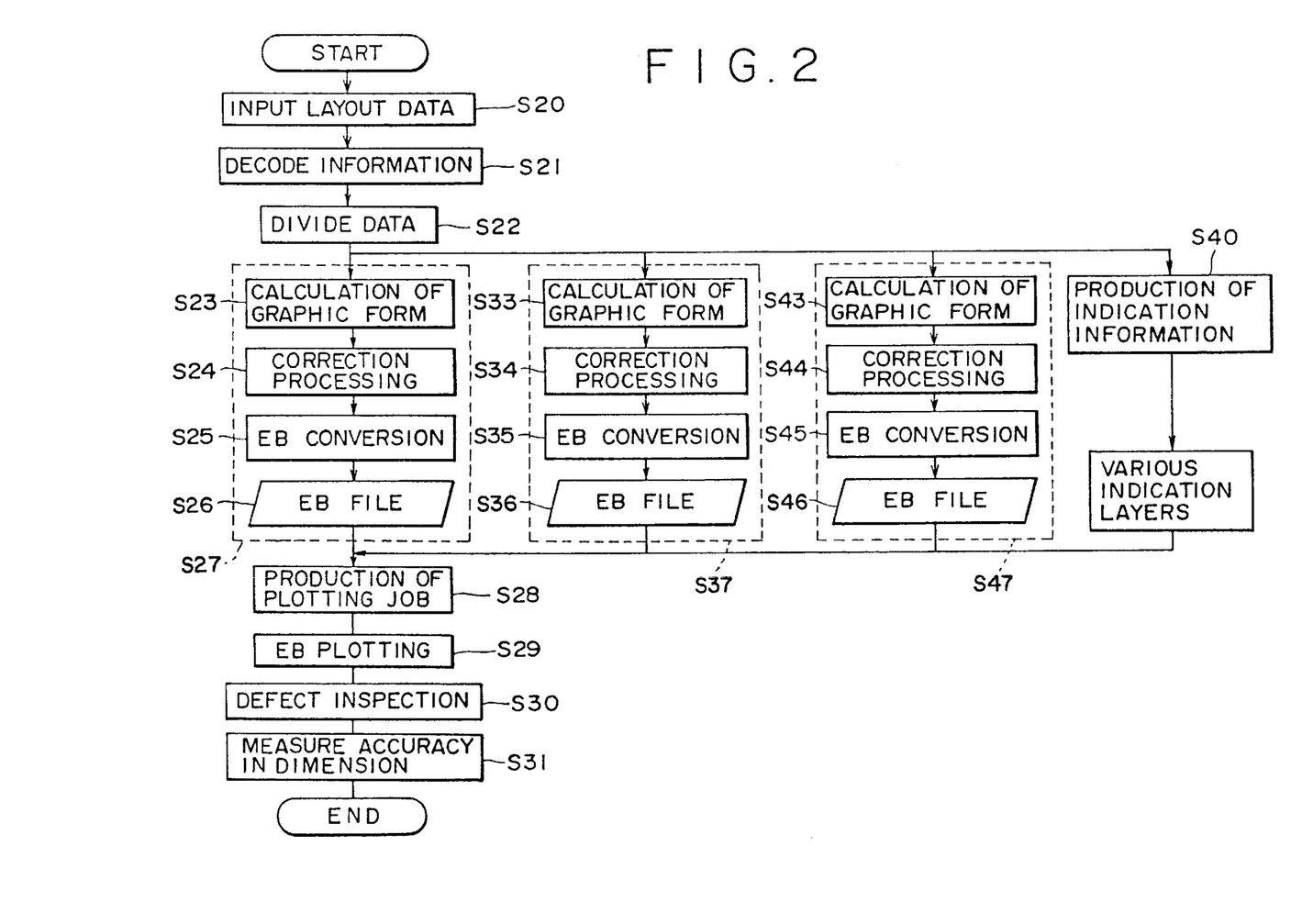
FIG. 2 is a flow chart illustrating an operation of the production system for an exposure mask shown in FIG. 1.

For example, by describing the following character train (2)

$$\text{MASK SEPARATE-CELL} \tag{2}$$

in a division processing object cell definition in layout data, data regarding the cell are extracted from the layout data, and one of processes 27, plotting job production section 37 and 47 illustrated in FIG. 2 or a process illustrated in FIG. 5 is selectively performed independently.

The characters "MASK" in the character train (2) represent a keyword indicating that the character train indicates indication data unique to the present embodiment different from the other character trains of property data and text data in the layout data. Meanwhile, "SEPARATE-CELL" represents a keyword indicative of a division processing object of the cell.

In the example given above, no object mask name is given as different from the graphic form calculation indication. This is because a process whose object is the entire mask pattern does not require any data which particularly specifies a mask.

Since the designated cell is cited from higher order cells, EB data processed in accordance with the indication described above is plotted based on the cited data in response to an arrangement indication in a plotting job.

Further, where division indication data designating a cell is included in a definition of a certain cell and the cell is cited by a plurality of higher order cells in a grating-like configuration, the data is represented as repetitive plotting in a plotting job.

Division Indication Data Designating Area

A rectangle indicating an area which makes an object of division processing in layout data is produced, and data indicating that the area is an object of division processing is added as property data to the rectangle.

For example, where layout data include a rectangle, by describing the following character train (3)

MASK SEPARATE-AREA   (3)

as property data of the rectangle, data regarding the area indicated by the rectangle is extracted from the layout data, and one of the processes 27, 37 and 47 illustrated in FIG. 2 or the process illustrated in FIG. 5 is selectively performed independently.

The characters "MASK" in the character train (3) represent a keyword indicating that the character train indicates indication data unique to the present embodiment different from the other character trains of property data and text data in the layout data. Meanwhile, "SEPARATE-AREA" represents a keyword indicative of a division processing object for the area.

Since the position on the exposure mask can be discriminated from area coordinates according to the designation, the position is reflected on a plotting position on a plotting job.

Further, where division indication data designating an area is included in a definition of a certain cell and the cell is cited by a plurality of higher order cells in a grating-line configuration, the data is represented as repetitive plotting in a plotting job.

The Other Division Indication Data

Also any other division processing can be indicated by adding division indication data similar to those given hereinabove.

For example, for division processing where different processing conditions are involved, a division processing indication similar to those described above is described after the different conditions are added, but for division processing where different degrees of accuracy are involved, the accuracy conditions are described as data. Further, where division processing is required from some other factor, it is possible to add data using a similar method to indicate division processing.

Inspection Area Indication Data

A defect inspection area can be designated by a method similar to the division indication data for designating an area described above. More particularly, a rectangular graphic form of an area of an inspection object is produced, and data indicating that the rectangular graphic form is an object of inspection and data indicative of identity with another area are added as property data to data of the rectangular graphic form.

For example, in a cell which corresponds to a chip in layout data, a rectangular pattern indicating the entire area of the cell which includes no scribe line is produced, and a character train (4) given below    MASK DCAREA A   (4)

is added as property data to data of the rectangular pattern so as to indicate to the defect inspection apparatus that the area is an object area of defect inspection.

The characters "MASK" in the character train (4) above represent a keyword indicating that the character train indicates indication data unique to the present embodiment different from the other character trains of property data and text data in the layout data. Meanwhile, "DCAREA" represents a keyword indicating that the area is an object area of defect inspection. Further, "A" is an ID character indicating an area pattern, and since a same ID character train represents that the area has the same pattern, it is indicated that defect inspection by comparison between the chips is possible.

If the same ID is not included on the exposure mask, then comparison with plotting data is selected.

In the present example, since inspection area indication data is added in data of a cell corresponding to a chip, where the mask has a form wherein same chips are included, also this cell ought to be cited by a plurality of times from a higher order cell, and accordingly, in the entire mask, a plurality of defect inspection indication data having a same ID are involved therein.

Dimension Indication Position Data (Accuracy Guarantee Indication Data)

A dimension measurement position for guaranteeing the dimensional accuracy of a mask is indicated by adding data, from which a measurement position, a direction and a dimension can be discriminated, in layout data.

Figure 3:
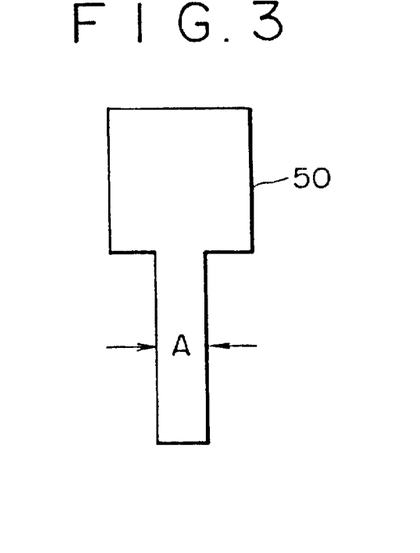
FIG. 3 is a diagrammatic view illustrating dimension indication position data used in the production system for an exposure mask shown in FIG. 1.
Figure 4:
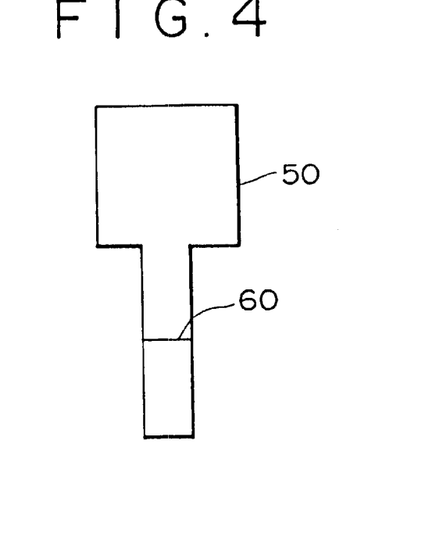
FIG. 4 is a similar view but illustrating a pass graphic form indicated by the dimension indication position data used in the production system for an exposure mask shown in FIG. 1.

In particular, for example, where a mask pattern 50 shown in FIG. 3 is included in layout data and it is intended to measure the dimension of a portion A, by plotting a path graphic form 60 indicating a measurement direction and a length on such a hierarchy on the layout data which do not have an influence on the mask pattern 50 as shown in FIG. 4 and describing the following character train (5)

MASK WSPEC GATE A   (5)

as property data on the path graphic form 60, it can be indicated to the dimension accuracy measuring instrument that the position of the path graphic form 60 is a dimension measurement position.

The direction of the path graphic form 60 is a dimension measurement direction, and the length of the graphic form 60 is used as a reference dimension.

The characters "MASK" in the character train (5) above represent a keyword indicating that the character train indicates indication data unique to the present embodiment different from the other character trains of property data and text data in the layout data. Meanwhile, "WSPEC" represents a keyword indicating that the indication represents a dimension measurement inspection. Further, "GATE" represents a name of the mask of a dimension measurement object. The dimension measurement indication requires data for specifying the exposure mask since it is data different among different exposure masks although the exposure masks are involved in the same LSI. Further, "A" is an ID character indicating a dimension measurement position, and where a plurality of same ID character trains are involved, particularly if the indications are directed to memory cells of a memory device, a large number of dimension measurement positions of the same ID are specified. In such an instance, a suitable number of dimension measurement positions for which measurement is actually possible are selected from among the dimension measurement positions to effect measurement.

Specification Data

Since data regarding specifications of an exposure mask are essentially independent of layout data, they need not necessarily be added to a pattern graphic form different from property data. It is only required that data indicating what specifications an object mask should have be indicated by a character train.

For example, where the mask size is 6 inches, the mask size can be indicated by describing the following character train (6)

MASK SIZE GATE 6 inch         (6)

at an arbitrary location in layout data.

The characters "MASK" in the character train (6) above represent a keyword indicating that the character train indicates indication data unique to the present embodiment different from the other character trains of property data and text data in the layout data. Meanwhile, "GATE" represents a name of the exposure mask. Further, "6 inch" indicates the size of the exposure mask. Also a material of the exposure mask, the thickness of the mask, the accuracy of the mask and a name to be indicated on the mask and so forth can be indicated in a similar manner.

In the following, an exposure mask production system which produces, inspects, and measures the dimensional accuracy of, an exposure mask using layout data including the indication data "MASK" described above is described.

Figure 1:
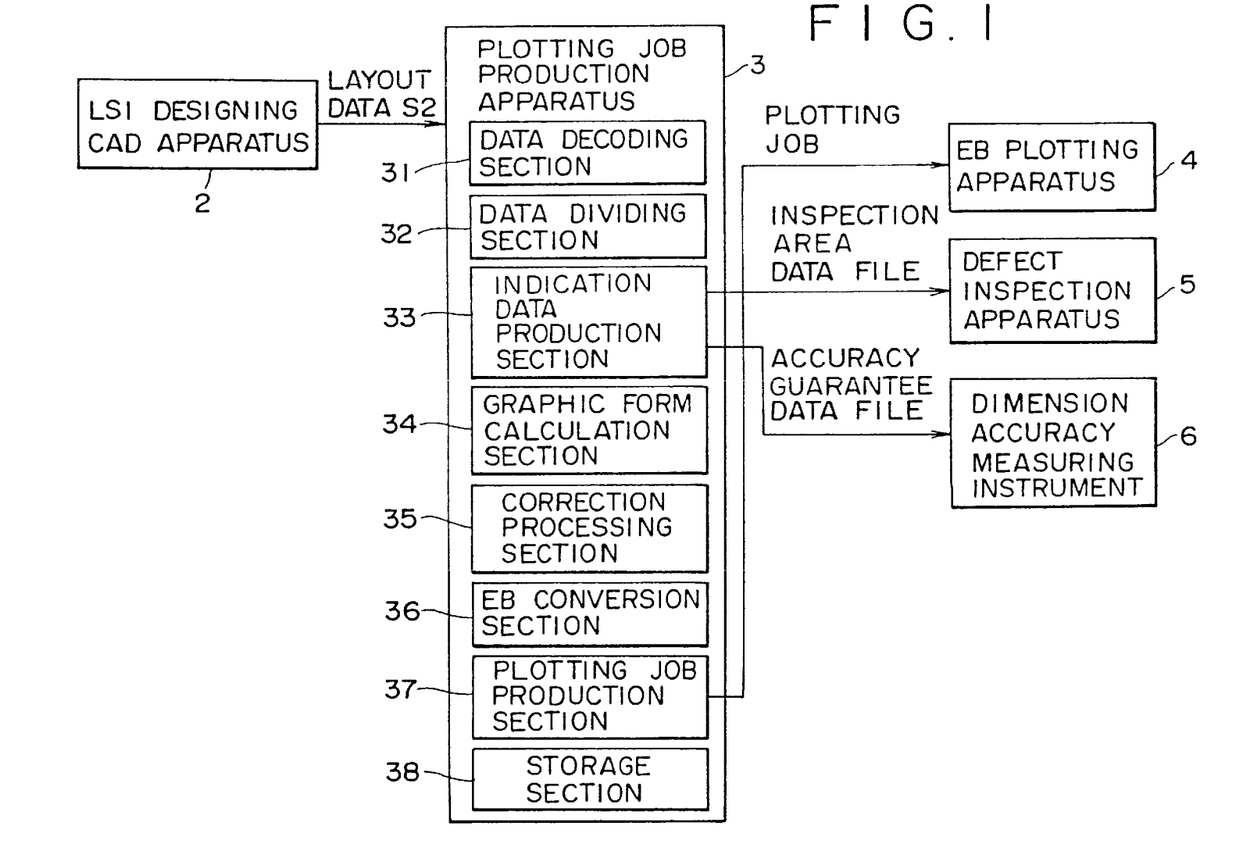
FIG. 1 is a block diagram showing a production system for an exposure mask to which the present invention is applied.

Referring to FIG. 1, the exposure mask production system is generally denoted at 1 and includes, for example, an LSI designing CAD apparatus 2, a plotting job production apparatus 3, an EB plotting apparatus 4, and a defect inspection apparatus 5 and a dimension accuracy measurement instrument 6 which serve as data processing means.

LST Designing CAD Apparatus 2

The LSI designing CAD apparatus 2 produces layout data in response to an operation of a designer. In this instance, the designer describes, in accordance with the necessity, graphic form calculation indication data, division indication data, inspection area indication data, dimension indication position data and specification data, in which the character train "MASK" is described at the top, as property data or text data in the layout data.

Plotting Job Production Apparatus 3

As shown in FIG. 1, the plotting job production apparatus 3 includes, for example, a data decoding section 31 serving as retrieval means, a data dividing section 32 serving as data processing means, an indication data production section 33 serving as file production means, a graphic form calculation section 34, a correction processing section 35, an EB conversion section 36, a plotting job production section 37 and a storage section 38.

The data decoding section 31 reads in layout data S2 and retrieves (decodes) those of property data and text data included in the layout data S2 which begin with the character train "MASK".

Then, the data decoding section 31 stores those data which are independent of a pattern of the exposure mask such as specification data as they are as a specification file into the storage section 38.

The data decoding section 31 stores data relating to a pattern of the exposure mask such as graphic form calculation indication data, division indication data, inspection area indication data and dimension indication position data into the storage section 38 together with a name of a cell in which the data are described and graphic form data of a graphic form such as a rectangle as property data.

In other words, a division data file corresponding to the division indication data, an inspection area data file corresponding to the inspection area indication data and an accuracy guarantee data file corresponding to the division indication position data are stored into the storage section 38.

The data dividing section 32 produces and outputs, where cell division is to be performed, an independent file regarding data regarding the object cell based on the division data file stored into the storage section 38 by the data decoding section 31, and designates the graphic form calculation indication stored therein so that one of the processes 27, 37 and 47 illustrated in FIG. 2 or the process illustrated in FIG. 5 is selectively performed.

Further, the data dividing section 32 retrieves a higher order cell hierarchy and stores citation coordinate position data of the object cell into the division data file. The citation coordinate position data thus stored are used for production of a plotting job by the EB conversion section 37. The data dividing section 32 deletes, after it stores the citation coordinate position data of the object cell, the citation of the object cell from the division data file.

On the other hand, where the division indication data designate an area, the data dividing section 32 clips the object area, produces and outputs an independent division data file regarding the area, and designates the graphic form calculation indication stored therein so that one of the processes 27, 37 and 47 illustrated in FIG. 2 or the process illustrated in FIG. 5 is selectively performed.

Then, the data dividing section 32 clips to remove the object area portion from the entire mask. Thereupon, the data dividing section 32 stores the clipped position into the division data file. The data of the clipped position is used later for production of a plotting job. When the designation of the object area is in a lower order hierarchy than the entire mask, a plurality of areas are clipped to remove them in most cases.

The indication data production section 33 outputs the division data file stored in the storage section 38 by the processing of the data decoding section 31 and the data dividing section 32 described above to the plotting job production section 37. Further, the indication data production section 33 outputs the specification file stored in the storage section 38 using, for example, a printer.

Further, the inspection area data file and the accuracy guarantee data file stored into the storage section 38 by the processing of the data decoding section 31 described above are outputted to the defect inspection apparatus 5 and the dimension accuracy measurement instrument 6 after processing described below is performed therefor.

The indication data production section 33 extracts the inspection area stored in the inspection area data file as coordinate values from the entire mask. This is because, where a lower order cell is designated, as viewed from the entire mask, not only the coordinate system is different, but also the number of cells is different as a result of citation of a plurality of cells. If a correct number of correct coordinate values as viewed from the entire mask can be extracted, then they are outputted as an inspection area file to the defect inspection apparatus 5. Since, also here, the coordinate values of the stored data and coordinates in a plotting job are different in terms of the mask magnification and so forth, the indication data production section 33 performs coordinate conversion also for eliminating such difference.

The indication data production section 33 performs an extracting operation for extracting the position data stored in the accuracy guarantee data file as coordinate values from the entire mask similarly as in the case of the inspection area indication data. However, for a memory device or the like, if the designation is directed to a memory cell, then a very large number of coordinate values are obtained.

Since it is impossible to actually perform accuracy measurement for all of memory cells to effect accuracy guarantee, upon extraction, only a suitable number of measurement points for which measurement is possible are extracted. For example, where a five-point measurement is to be performed, such a method that only five locations of the left lower corner, the left upper corner, the right lower corner, the right upper corner and the center are extracted is taken. Coordinate values extracted in this manner are outputted to the dimension accuracy measurement instrument 6 after coordinate conversion is performed for them.

The graphic form calculation section 34 selectively performs one of the graphic form calculation processes S23, S33 and S43 illustrated in FIG. 2 for the individual ones of the divided layout data in response to an indication from the data dividing section 32.

The correction processing section 35 selectively performs one of the correction processes S24, S34 and S44 illustrated in FIG. 2 for the graphic form calculation processed data in response to an indication from the data dividing section 32.

The EB conversion section 36 selectively performs one of the EB conversion processes S25, S35 and S45 illustrated in FIG. 2 for the correction processed data in response to an indication from the data dividing section 32 to produce an EB file 26, 36 or 46.

The plotting job production section 37 classifies such EB files 26, 36 and 46 produced by the EB conversion processes S25, S35 and S45 illustrated in FIG. 2 for individually same EB files based on the position data for arrangement of the EB files such as the citation coordinate position data included in the division data file stored in the storage section 38, and produces, if the EB files have some repeatability, a plotting job representing such repetitive plotting indication. In this instance, since the coordinate systems of the coordinate values of the position data of the division data files and the coordinates in the plotting job are different from each other in terms of the mask magnification or the like, the plotting job production section 37 performs coordinate conversion also for eliminating such difference.

As described above, the data with "MASK" added to the layout data are outputted, after they are worked into a file, as a data file to the data dividing section 32, plotting job production section 37, defect inspection apparatus 5 and dimension accuracy measurement instrument 6.

In the following, operation of the exposure mask production system 1 shown in FIG. 1 is described with reference to the flow chart shown in FIG. 2.

First, the designer produces layout data using the LSI designing CAD apparatus 2. In this instance, the designer describes, in accordance with the necessity, graphic form calculation indication data, division indication data, inspection area indication data, dimension indication position data and specification data, in which the character train of "MASK" is described at the top, as property data or text data in the layout data.

Then, the layout data S2 are inputted to the plotting job production apparatus 3 (step S20). Thereafter, the data decoding section 31 decodes the layout data S2 (step S21) and retrieves the character train "MASK" to extract the graphic form calculation indication data, division indication data, inspection area indication data, dimension indication position data and specification data. The thus extracted data are stored as the division data file, inspection area data file, accuracy guarantee data file and specification file into the storage section 38 as described hereinabove.

Then, the data dividing section 32 extracts data of a cell or an area which makes an object of division from the layout data based on the division data file stored in the storage section 38, produces an independent file based on the extracted data and selectively performs one of the processes 27, 37 and 47 illustrated in FIG. 2 or the process illustrated in FIG. 5 based on the file. The data dividing section 32 further retrieves a higher order cell hierarchy and stores citation coordinate position data of the object cell and so forth into the division data file.

The division data file is outputted to the plotting job production section 37.

Then, one of the processes 27, 37 and 47 is selectively performed for the independent file produced by the data dividing section 32 to produce an EB file 26, 36 or 46.

Further, the indication data production section 33 outputs the specification file stored in the storage section 38 to a printer or a like apparatus (step S40). Further, the indication data production section 33 performs predetermined processes individually for the inspection area data file and the accuracy guarantee data file and outputs the resulting files to the defect inspection apparatus 5 and the dimension accuracy measurement instrument 6, respectively (step S40).

Thereafter, the plotting job production section 37 produces a plotting job from the EB files 26, 36 and 46 and the division data file (step S28) and outputs the plotting job to the EB plotting apparatus 4.

Then, the EB plotting apparatus 4 performs plotting based on the plotting job to produce an exposure mask (step S29).

Then, the defect inspection apparatus 5 performs defect inspection of an area determined in accordance with the inspection area data file for the thus produced exposure mask.

Further, the dimension accuracy measurement instrument 6 performs line width measurement of a location determined in accordance with the accuracy guarantee data file for the produced exposure mask.

As described above, according to the exposure mask production system 1, in a process of production of an exposure mask, various necessary data are extracted from layout data to automatically produce files, and the files are outputted to the data dividing section 32, plotting job production section 37, defect inspection apparatus 5 and dimension accuracy measurement instrument 6. Consequently, since complication in delivery of data is eliminated and a medium such as paper is not used, burdens to a designer and working people can be reduced and a mistake in reading or copying of data can be prevented.

Further, according to the exposure mask production system 1, since indication of coordinate values and so forth is automatically performed based on layout data, a mistake in reading of coordinate values and so forth can be eliminated.

As a result, according to the exposure mask production system 1, the period for production of an exposure mask can be reduced and an exposure mask having a high degree of reliability can be produced.

The present invention is not limited to the specific embodiment described above.

For example, in the exposure mask production system 1 described hereinabove with reference to FIG. 1, all of the data dividing section 32 of the plotting job production apparatus 3, the defect inspection apparatus 5 and the dimension accuracy measurement instrument 6 need not necessarily be provided, but at least one of them should be provided. Further, only the specification data included on the layout data S2 may be outputted.

Further, while property data and text data are given as the character trains (1) to (6) hereinabove, they may be represented in arbitrary representation forms.

Furthermore, although, in the embodiment described above, the division data file, inspection area data file, accuracy guarantee data file and specification file are produced separately from each other, a single unified file containing contents of all of the files may be produced instead.

Having now fully described the invention, it will be apparent to one of ordinary skill in the art that many changes and modifications can be made thereto without departing the spirit and scope of the invention as set forth herein.

What is claimed is:

1. A method of producing an exposure mask, comprising the steps of:
   receiving layout data;
   performing data process for the layout data;
   retrieving, from the processed layout data, indication data which indicate a data process of an exposure mask and include a predetermined index code;
   producing an indication file based on the indication data;
   generating a pattern file from the processed layout data;
   generating a plotting job from the pattern file and the indication file; and
   performing plotting based on the plotting job to produce the exposure mask.

2. A method of producing an exposure mask according to claim 1, wherein the data process is a process for dividing the layout data in accordance with a processing condition.

3. A method of producing an exposure mask according to claim 2, wherein the layout data is decoded by storing data which are independent of a pattern of the exposure mask.

4. A method of producing an exposure mask according to claim 1, wherein the data process is a process of inspecting a predetermined area of the exposure mask.

5. A method of producing an exposure mask according to claim 1, wherein the data process is a process of guaranteeing an accuracy of a predetermined position of the exposure mask.

6. A method of producing an exposure mask according to claim 1, wherein the data process is a process of outputting contents of specifications of an exposure mask.

7. A method of producing an exposure mask according to claim 1, wherein the indication data are character train data added in a definition of the layout data.

8. An apparatus for producing an exposure mask wherein plotting is performed based on a plotting job produced from layout data to produce an exposure mask, comprising:
   receiving the layout data;
   performing data process for the layout data;
   retrieval means for retrieving, from the processed layout data, indication data which indicate a data process of the exposure mask and include a predetermined index code;
   file production means for producing an indication file based on the indication data;
   generating means for creating a pattern file from the processed layout data; and
   plotting means for producing said exposure mask based on the plotting job generated from the pattern file and the indication file.

9. An apparatus for producing an exposure mask according to claim 8, wherein said data processing means divides the layout data in accordance with a processing condition.

10. An apparatus for producing an exposure mask according to claim 9, further comprising decoding means for storing data which are independent of a pattern of the exposure mask.

11. An apparatus for producing an exposure mask according to claim 8, wherein said data processing means inspecting a predetermined area of a previously produced exposure mask.

12. An apparatus for producing an exposure mask according to claim 8, wherein said data processing means guaranteeing an accuracy of a predetermined position of a previously produced exposure mask.

13. An apparatus for producing an exposure mask according to claim 8, wherein said data processing means outputs contents of specifications of an exposure mask.

14. An apparatus for producing an exposure mask according to claim 8, wherein the indication data are character train data added in a definition of the layout data.

* * * * *